United States Patent
Nakai

[11] Patent Number: 5,864,170
[45] Date of Patent: Jan. 26, 1999

[54] SEMICONDUCTOR DEVICE HAVING BONDING PAD AND SCRIBE LINE

[75] Inventor: Junichi Nakai, Fukuyama, Japan

[73] Assignee: Sharp Kabushiki Kaisha, Osaka, Japan

[21] Appl. No.: 915,852

[22] Filed: Aug. 21, 1997

[30] Foreign Application Priority Data

Dec. 20, 1996 [JP] Japan ..................................... 8-340685

[51] Int. Cl.⁶ ................................................. H01L 23/544
[52] U.S. Cl. .......................... 257/620; 257/626; 257/638; 257/632
[58] Field of Search ..................................... 257/632, 635, 257/638, 640, 626, 773, 780, 784, 620; 438/113, 620

[56] References Cited

U.S. PATENT DOCUMENTS

| | | | |
|---|---|---|---|
| 4,364,078 | 12/1982 | Smith et al. | 257/620 |
| 4,835,592 | 5/1989 | Zommer | 257/620 |
| 5,237,199 | 8/1993 | Morita | 257/638 |

*Primary Examiner*—Tom Thomas
*Assistant Examiner*—Hung K. Vu
*Attorney, Agent, or Firm*—Dike, Bronstein, Roberts & Cushman; David G. Conlin

[57] ABSTRACT

A semiconductor device in accordance with the present invention has a passivation film. The passivation film is provided on the entire surface of a substrate provided with a bonding pad and a scribe line. After applying a photoresist on the entire surface of the passivation film, a photoresist pattern is contoured. The photoresist pattern thus contoured is exposed and developed so as to be patterned. The photoresist is patterned so as to (1) provide an opening which is a connected region of a region to be the bonding pad and a region to be the scribe line, and (2) make angles of the patterning obtuse angles. Then, the passivation film is etched, and the photoresist is removed. With this arrangement, a removing solution and a resist residue do not remain in the opening section provided on a portion of the passivation film corresponding to the bonding pad, thereby preventing a quality deterioration such as corrosion of the bonding pad and breakage of wire bonding.

6 Claims, 4 Drawing Sheets

SEMICONDUCTOR DEVICE HAVING BONDING PAD AND SCRIBE LINE

FIELD OF THE INVENTION

The present invention relates to a semiconductor device.

BACKGROUND OF THE INVENTION

In general, a semiconductor device includes scribe lines and bonding pads. The former is required for dividing a wafer into chips by dicing, and the latter is required for wire bonding. When manufacturing such a semiconductor device, it is a common method to remove a passivation film (for example, silicon oxide film, silicon nitride film, or other films) provided on the scribe lines and the bonding pads before dividing a wafer into chips. FIG. 3(a) and FIG. 3(b) illustrate an example of such a method.

First, as shown in FIG. 3(a), a bonding pad 12 and a scribe line 13 are provided on a substrate 11, and a passivation film 14 is provided so as to cover the substrate thus provided with the bonding pad 12 and the scribe line 13. Then, a photoresist 15 is applied to the passivation film 14 so as to form a photoresist pattern by exposure. The photoresist pattern is formed in such a manner that openings are formed above the bonding pad 12 and the scribe line 13.

Next, as shown in FIG. 3(b), the photoresist 15 having such a predetermined pattern thus prepared is used as a mask so as to remove the passivation film 14 provided on the bonding pad 12 and the scribe line 13. For this purpose, the plasma etching method or other methods may be adopted. Thereafter, the photoresist 15 is removed.

A photoresist pattern adopted in a conventional semiconductor device has a problem in that if a passivation film has a thickness in an order of several $\mu$m, when exposing and developing a photoresist, developer and a resist residue remain on the photoresist pattern. This adversely affects the etching of the passivation film such that abnormal etching is caused and an etching residue is generated. Note that, when adopting a thin passivation film having a thickness in an order of hundreds of nm, the above-mentioned problems are not caused.

FIG. 4(a) shows respective portions of the bonding pad 12 and the scribe line 13 of a conventional semiconductor device. FIG. 4(a) also shows a photoresist pattern (portions enclosed by the alternate long and two short dashes) which is formed when portions of the passivation film 14 covering the bonding pad 12 and the scribe line 13 are selectively removed. Namely, the photoresist pattern is formed such that opening sections 15a and 15b of the photoresist 15 are provided respectively above the bonding pad 12 and the scribe line 13.

FIG. 4(b) is a cross sectional view taken along a line B—B of FIG. 4(a). In a conventional arrangement, as shown in FIG. 4(b), a resist residue 16 remains at the bottom of the opening section 15a above the bonding pad 12.

FIG. 4(c) is a cross sectional view showing the semiconductor device from which the photoresist 15 has been removed. As shown in FIG. 4(c), a removing solution or an etching residue 17 remain in the opening section 14a corresponding to the bonding pad 12. This causes a quality deterioration such as corrosion of a bonding pad and breakage of wire bonding.

SUMMARY OF THE INVENTION

It is an object of the present invention to completely eliminate a resist residue, an etching residue, and a removing solution residue which are on a passivation film of a bonding pad so as to provide a high quality semiconductor device in which no corrosion of the bonding pad or no breakage of wire bonding occurs.

In order to achieve the above objects, a semiconductor device of the present invention is characterized by including a bonding pad and a scribe line, provided on a surface of the substrate, and a passivation film provided on the surface of the substrate, wherein the passivation film includes a first region and a second region which are provided with the bonding pad and the scribe line, respectively, the passivation film including opening sections respectively corresponding to the first and second regions, and the opening sections respectively corresponding to the first and second regions are connected with each other.

With this arrangement, the bonding pad and the scribe line are connected by patterning of the opening sections which are formed by partially removing the passivation film. This permits developer for developing the photoresist and a removing solution to be drained off more thoroughly, and more thorough washing of the semiconductor device after developing and removing the photoresist. Therefore, generation of such residue as the resist residue, the etching residue, and the removing solution residue can be prevented.

For a fuller understanding of the nature and advantages of the invention, reference should be made to the ensuing detailed description taken in conjunction with the accompanying drawings.

DESCRIPTION OF THE EMBODIMENTS

Figure 1A:
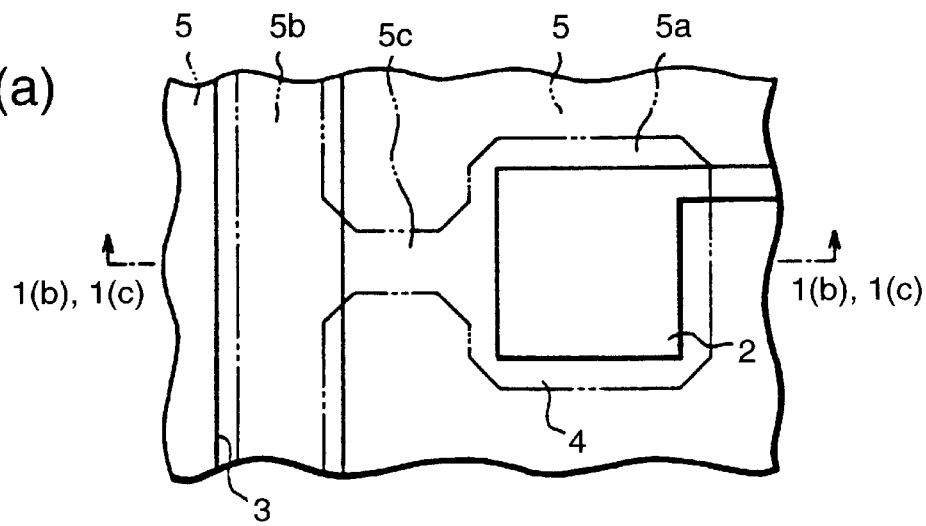
FIG. 1(a) is a plan view showing a schematic structure of a main portion of a semiconductor device in accordance with one embodiment of the present invention.

FIG. 1(a) shows respective portions of a bonding pad 2 and a scribe line 3 of a semiconductor device in accordance with one embodiment of the present invention.

Figure 1B:
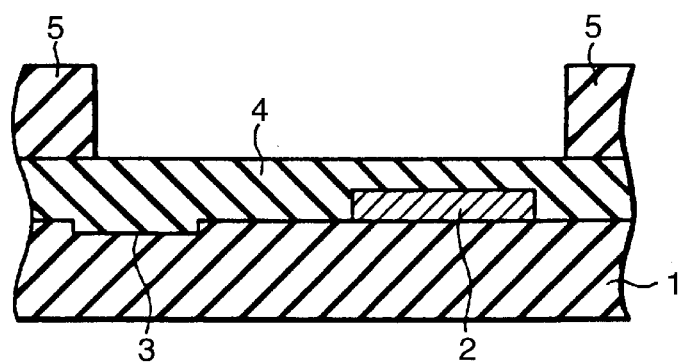
FIG. 1(b) is a cross sectional view of FIG. 1(a) taken along a line A—A in which a photoresist pattern has been provided.

FIG. 1(b) is a cross sectional view of FIG. 1(a) taken on the line A—A showing the bonding pad and a passivation film 4 which are provided in this order. FIG. 1(b) also shows an arrangement wherein a photoresist 5 (mask) has been provided so as to form openings respectively corresponding to the bonding pad 2 and the scribe line 3.

In other words, the photoresist 5 (mask) is provided in such a manner that an opening section 5a and an opening section 5b are provided on portions respectively corresponding to the bonding pad 2 and the scribe line 3.

Figure 1C:
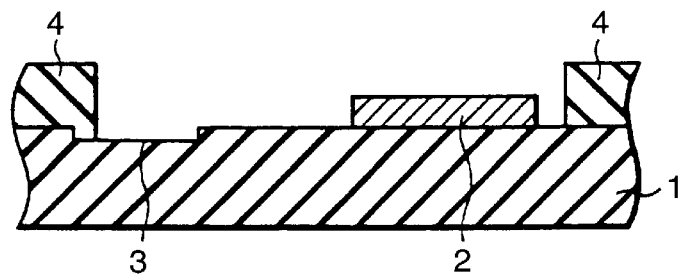
FIG. 1(c) is a cross sectional view of FIG. 1(a) taken along a line A—A from which the photoresist pattern has been removed.

FIG. 1(c) shows an arrangement wherein the passivation film 4 has been removed by the etching, and thereafter the photoresist 5 has been removed.

The semiconductor device of FIG. 1(a) through FIG. 1(c) are provided with a substrate 1, the bonding pad 2, the scribe line 3, the passivation film 4, and the photoresist 5. The bonding pad 2 is provided on the substrate 1. The passivation film 4 is provided so as to cover the respective surfaces of the substrate 1, the bonding pad 2, and the scribe line 3. The photoresist 5 is provided so as to selectively remove the passivation film 4.

The semiconductor device of the present embodiment is characterized in that openings are provided on regions of the passivation film 4 respectively corresponding to the bonding pad 2 and the scribe line 3, and the two openings thus provided are connected so as to form a single opening.

Namely, as shown in FIG. 1(a), regions of the passivation film 4 respectively corresponding to the bonding pad 2 and the scribe line 3 are removed so as to form the opening sections 5a and 5b. The opening sections 5a and 5b thus formed are connected so as to form a single opening section. Specifically, the passivation film 4 has respective opening sections on (1) the bonding pad 2, (2) the scribe line 3, and (3) a region between the bonding pad 2 and the scribe line 3. These opening sections are connected with each other so as to form a single opening section.

The following will describe manufacturing steps of the semiconductor device in accordance with the present embodiment referring to FIG. 1(a) through FIG. 1(c).

The passivation film 4 is provided on the entire surface of the substrate 1 provided with the bonding pad 2 and the scribe line 3. The passivation film 4 is an organic polymer film. Here, instead of the organic polymer film, it is possible to adopt (1) a silicon oxidation film, (2) a silicon nitride film, or (3) a laminated film composed of at least two films selected from the group consisting of the silicon oxidation film, the silicon nitride film, and the organic polymer film.

The photoresist 5 is applied to the entire surface of the side of the substrate 1 on which the bonding pad 2 and the scribe line 3 are provided. After the photoresist 5 is applied, as shown by the alternate long and two short lines in FIG. 1(a), a in photoresist pattern is contoured for the opening section 5a, the opening section 5b, and an opening section 5c. The opening section 5a and the opening section 5b are to be provided on regions where the bonding pad 2 and the scribe line 3 are provided, respectively. The opening section 5c is to be provided so as to connect the opening section 5a and the opening section 5b. Thereafter, the photoresist 5 is exposed and developed so as to be patterned (see FIG. 1(a) and FIG. 1(b)).

Note that, as shown in FIG. 1(a), the photoresist 5 is patterned in such a manner that the interior angles of the photoresist pattern, namely, the angle of the bending portions of the photoresist pattern are obtuse angles. This permits a removing solution to be drained off more thoroughly, and more thorough washing of the semiconductor device.

Figure 2:
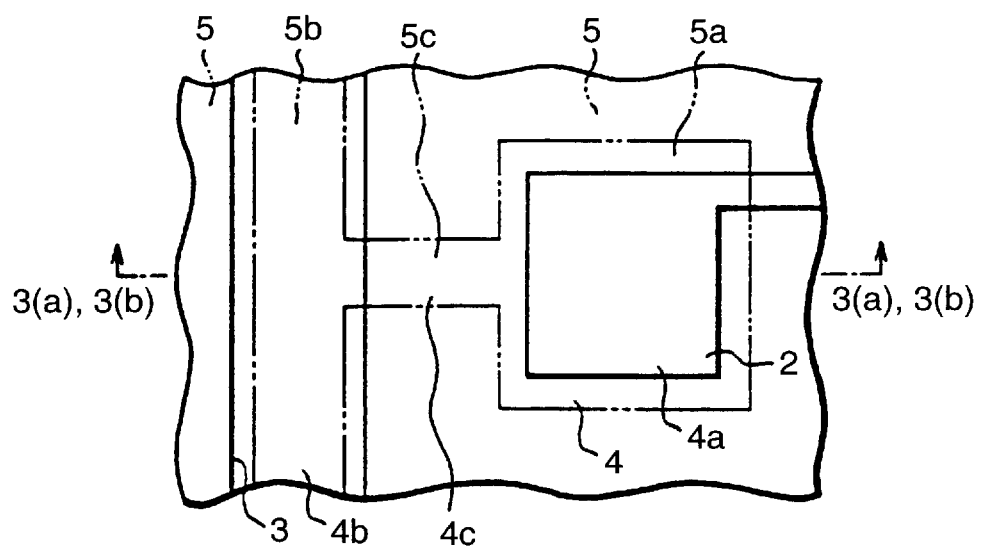
FIG. 2 is a plan view showing another example of a schematic structure of a main portion of the semiconductor device of the present invention.
Figure 3A:
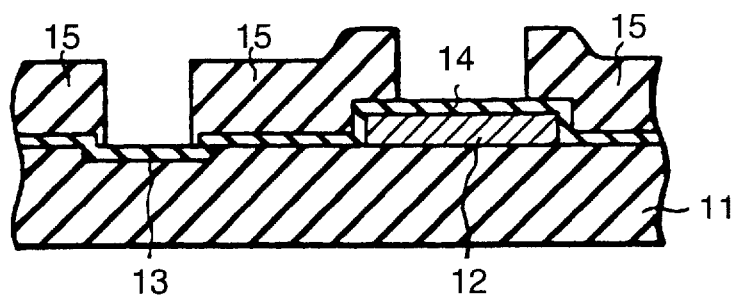
FIG. 3(a) is a cross sectional view showing the semiconductor device in which a photoresist pattern has been provided, and FIG. 3(a) also shows steps of removing a passivation film when manufacturing a conventional semiconductor device.
Figure 3B:
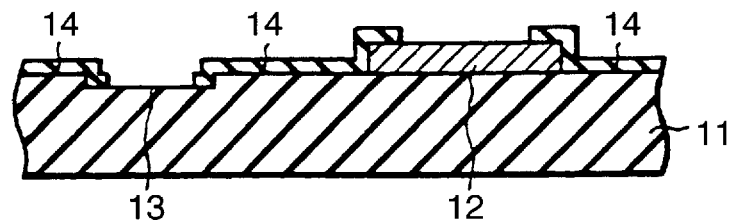
FIG. 3(b) is a cross sectional view showing the semiconductor device of FIG. 3(a) from which the photoresist pattern has been removed.
Figure 4A:
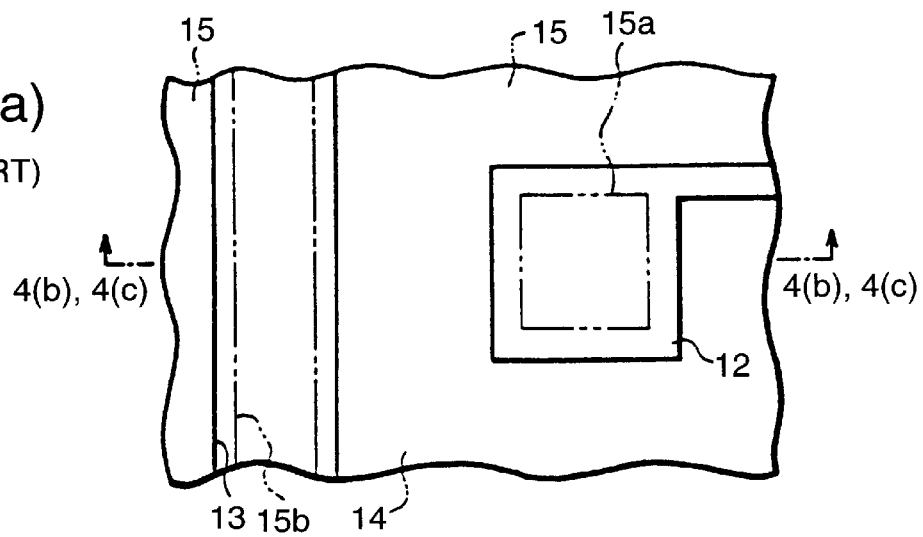
FIG. 4(a) is a plan view showing a schematic structure of a main portion of a conventional semiconductor device.
Figure 4B:
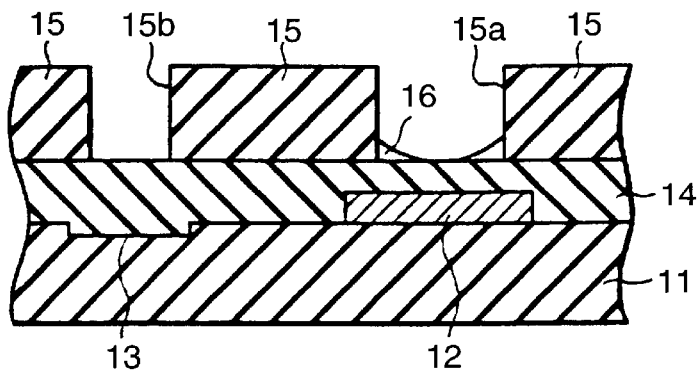
FIG. 4(b) is a cross sectional view of FIG. 4(a) taken along a line B—B in which the photoresist pattern has been provided.
Figure 4C:
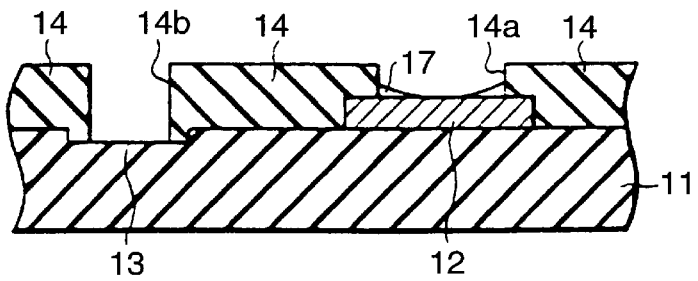
FIG. 4(c) is a cross sectional view of FIG. 4(a) taken along a line B—B from which the photoresist pattern has been removed.

Alternatively, as shown in FIG. 2, it is possible to form a photoresist pattern in which the bending portions are right angled. Here, the cross sectional view of FIG. 2 taken along a line A'—A' is the same as that of Fig. 1(b).

The photoresist 5 thus patterned is used as a mask so as to etch the passivation film 4 by the plasma etching method or other methods. Thereafter, the photoresist 5 is removed (see FIG. 1(c)).

According to the semiconductor device manufactured by the described steps, respective regions of the passivation film where bonding pad and the scribe line are provided are removed, and the opening sections respectively corresponding to the two regions are connected with each other. This permits developer and a removing solution to be drained off more thoroughly, and more thorough washing of the semiconductor device after developing and removing the photoresist. In other words, generation of such residue as the resist residue, the etching residue, and a removing solution residue can be prevented, thereby improving the quality of the semiconductor device.

In particular, when a semiconductor device is CCD (charge coupled device) or other devices, in the case of providing a color filter or a micro lens directly on a chip of the semiconductor device, the film thickness of the passivation film (in this case, primarily the organic polymer film) becomes in an order of several $\mu$m. This facilitates the generation of such residue as the resist residue, the etching residue, and the removing solution residue. However, when adopting the present invention in such a case, a high quality semiconductor device can be realized.

Further, in the case where the angles of the bending portions of the patterning contouring a portion of the passivation film which has been removed are obtuse angles, a removing solution can be drained off more thoroughly, and more thorough washing of the semiconductor device can be carried out, thereby further improving the quality of the semiconductor device. The patterning contours a portion of the passivation film which has been removed.

As described, a first semiconductor device of the present invention is characterized by including a bonding pad and a scribe line, provided on a surface of the substrate, and a passivation film provided on the surface of the substrate, wherein the passivation film includes a first region and a second region which are provided with the bonding pad and the scribe line, respectively, the passivation film including opening sections respectively corresponding to the first and second regions, and the opening sections respectively corresponding to the first and second regions are connected with each other.

With this arrangement, the bonding pad and the scribe line are connected by opening patterning which is formed by partially removing the passivation film. This permits developer for developing the photoresist and a removing solution to be drained off more thoroughly, and more thorough washing of the semiconductor device after developing and removing the photoresist. Therefore, generation of such residue as the resist residue, the etching residue, and the removing solution residue can be prevented, thereby improving the quality of the semiconductor device.

A second semiconductor device of the present invention in accordance with the first semiconductor device is characterized in that the angles made by the patterning of each opening section of the passivation film are obtuse angles.

With this arrangement, a removing solution can be drained off even more thoroughly, and more thorough washing of the semiconductor device can be carried out due to the fact that the angles made by the patterning of the opening section 5 which has been formed by removing a portion of the passivation film are obtuse angles, thereby further improving the quality of the semiconductor device.

A third semiconductor device of the present invention in accordance with the first semiconductor device is characterized in that the passivation film is (1) the silicon oxidation film, (2) the silicon nitride film, (3) the organic polymer film, or (4) a laminated film composed of at least two films selected from the above mentioned films.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device, comprising:

a substrate;

a bonding pad and a scribe line, provided on a surface of the substrate; and a passivation film provided on the surface of the substrate, wherein the passivation film includes a first region and a second region which are provided with the bonding pad and the scribe line, respectively, said passivation film including opening sections respectively corresponding to the first and second regions, and the opening sections respectively corresponding to the first and second regions are connected with each other.

2. The semiconductor device as set forth in claim 1, wherein angles of bending portions of contour lines of the each opening section are obtuse angles.

3. The semiconductor device as set forth in claim 1, wherein the passivation film is a silicon oxidation film.

4. The semiconductor device as set forth in claim 1, wherein the passivation film is a silicon nitride film.

5. The semiconductor device as set forth in claim 1, wherein the passivation film is an organic polymer film.

6. The semiconductor device as set forth in claim 1, wherein the passivation film is a laminated film composed of at least two films selected from the group consisting of a silicon oxidation film, a silicon nitride film, and an organic polymer film.

* * * * *